United States Patent
Parthasarathy et al.

(10) Patent No.: US 8,552,493 B2
(45) Date of Patent: Oct. 8, 2013

(54) SEGMENTED PILLAR LAYOUT FOR A HIGH-VOLTAGE VERTICAL TRANSISTOR

(75) Inventors: Vijay Parthasarathy, Mountain View, CA (US); Wayne Bryan Grabowski, Los Altos, CA (US)

(73) Assignee: Power Integrations, Inc., San Jose, CA (US)

( * ) Notice: Subject to any disclaimer, the term of this patent is extended or adjusted under 35 U.S.C. 154(b) by 613 days.

(21) Appl. No.: 12/455,462

(22) Filed: Jun. 2, 2009

(65) Prior Publication Data
US 2009/0273023 A1    Nov. 5, 2009

Related U.S. Application Data

(63) Continuation of application No. 11/707,406, filed on Feb. 16, 2007, now Pat. No. 7,557,406.

(51) Int. Cl.
*H01L 29/78* (2006.01)

(52) U.S. Cl.
USPC  257/331; 257/488; 257/E29.26; 257/E29.262

(58) Field of Classification Search
USPC ............ 257/328–342, 488, E29.26, E29.262
See application file for complete search history.

(56) References Cited

U.S. PATENT DOCUMENTS

| | | | |
|---|---|---|---|
| 4,553,084 A | 11/1985 | Wrathall | |
| 4,908,682 A | 3/1990 | Takahashi | |
| 4,951,102 A | 8/1990 | Beitman et al. | |
| 5,408,141 A | 4/1995 | Devore et al. | |
| 5,411,901 A | 5/1995 | Grabowski et al. | |
| 5,798,554 A | 8/1998 | Grimaldi et al. | |
| 5,821,580 A | 10/1998 | Kuwahara | |
| 6,204,533 B1* | 3/2001 | Williams et al. | ............ 257/341 |
| 6,251,716 B1 | 6/2001 | Yu | |
| 6,281,705 B1 | 8/2001 | Yu | |
| 6,304,007 B1 | 10/2001 | Yu | |
| 6,307,223 B1 | 10/2001 | Yu | |
| 6,337,498 B1 | 1/2002 | Hasegawa et al. | |
| 6,349,047 B1 | 2/2002 | Yu | |
| 6,355,513 B1 | 3/2002 | Yu | |
| 6,356,059 B1 | 3/2002 | Yu | |
| 6,486,011 B1 | 11/2002 | Yu | |
| 6,528,880 B1 | 3/2003 | Planey | |
| 6,542,001 B1 | 4/2003 | Yu | |
| 6,549,439 B1 | 4/2003 | Yu | |

(Continued)

FOREIGN PATENT DOCUMENTS

| | | |
|---|---|---|
| DE | 4309764 | 9/1994 |
| EP | 0962987 | 12/1999 |

(Continued)

*Primary Examiner* — Marcos D. Pizarro
(74) *Attorney, Agent, or Firm* — The Law Offices of Bradley J. Bereznak

(57) ABSTRACT

In one embodiment, a transistor fabricated on a semiconductor die includes a first section of transistor segments disposed in a first area of the semiconductor die, and a second section of transistor segments disposed in a second area of the semiconductor die adjacent the first area. Each of the transistor segments in the first and second sections includes a pillar of a semiconductor material that extends in a vertical direction. First and second dielectric regions are disposed on opposite sides of the pillar. First and second field plates are respectively disposed in the first and second dielectric regions. Outer field plates of transistor segments adjoining first and second sections are either separated or partially merged.

6 Claims, 7 Drawing Sheets

(56) References Cited

U.S. PATENT DOCUMENTS

| | | |
|---|---|---|
| 6,566,936 B1 | 5/2003 | Yu |
| 6,580,252 B1 | 6/2003 | Yu |
| 6,614,289 B1 | 9/2003 | Yu |
| 6,621,722 B1 | 9/2003 | Yu |
| 6,661,276 B1 | 12/2003 | Chang |
| 6,674,107 B1 | 1/2004 | Yu |
| 6,696,706 B1 | 2/2004 | Pegler |
| 6,730,585 B2 | 5/2004 | Disney |
| 6,734,715 B1 | 5/2004 | Yu |
| 6,747,342 B1 | 6/2004 | Planey |
| 6,750,698 B1 | 6/2004 | Yu |
| 6,774,417 B1 | 8/2004 | Lin et al. |
| 6,777,722 B1 | 8/2004 | Yu et al. |
| 6,812,079 B1 | 11/2004 | Pegler |
| 6,887,768 B1 | 5/2005 | Yu |
| 6,900,506 B1 | 5/2005 | Yu et al. |
| 6,921,932 B1 | 7/2005 | Yu et al. |
| 6,975,157 B1 | 12/2005 | Yu |
| 6,995,052 B1 | 2/2006 | Yu et al. |
| 7,009,228 B1 | 3/2006 | Yu |
| 7,009,229 B1 | 3/2006 | Lin et al. |
| 7,038,260 B1 | 5/2006 | Yu |
| 7,045,397 B1 | 5/2006 | Yu et al. |
| 7,075,132 B1 | 7/2006 | Lin et al. |
| 7,098,634 B1 | 8/2006 | Yu |
| 7,122,885 B2 | 10/2006 | Planey |
| 7,211,845 B1 | 5/2007 | Yu et al. |
| 7,220,661 B1 | 5/2007 | Yu et al. |
| 7,227,242 B1 | 6/2007 | Lin et al. |
| 7,238,976 B1 | 7/2007 | Yu et al. |
| 7,262,461 B1 | 8/2007 | Yu et al. |
| 7,265,398 B1 | 9/2007 | Yu |
| 7,268,378 B1 | 9/2007 | Yu et al. |
| 7,345,342 B2 | 3/2008 | Challa et al. |
| 7,348,826 B1 | 3/2008 | Klein et al. |
| 7,417,266 B1 | 8/2008 | Li et al. |
| 7,452,763 B1 | 11/2008 | Yu |
| 7,554,152 B1 | 6/2009 | Ranucci et al. |
| 7,557,406 B2 | 7/2009 | Parthasarathy |
| 7,585,719 B2 | 9/2009 | Balakrishnan |
| 7,595,523 B2 | 9/2009 | Parthasarathy et al. |
| 7,608,888 B1 | 10/2009 | Li et al. |
| 7,648,879 B2 | 1/2010 | Banerjee et al. |
| 7,655,964 B1 | 2/2010 | Lin et al. |
| 7,696,540 B2 | 4/2010 | Francis et al. |
| 7,696,598 B2 | 4/2010 | Francis et al. |
| 7,732,860 B2 | 6/2010 | Parthasarathy et al. |
| 7,745,291 B2 | 6/2010 | Disney |
| 7,746,156 B1 | 6/2010 | Massie et al. |
| 7,786,533 B2 | 8/2010 | Disney |
| 7,791,132 B2 | 9/2010 | Banerjee et al. |
| 7,816,731 B2 | 10/2010 | Parthasarathy et al. |
| 7,829,944 B2 | 11/2010 | Disney |
| 7,859,037 B2 | 12/2010 | Parthasarathy et al. |
| 7,863,172 B2 | 1/2011 | Zhu et al. |
| 7,871,882 B2 | 1/2011 | Parthasarathy |
| 7,875,962 B2 | 1/2011 | Balakrishnan |
| 7,893,754 B1 | 2/2011 | Kung |
| 7,932,738 B1 | 4/2011 | Banerjee et al. |
| 7,939,853 B2 | 5/2011 | Murphy et al. |
| 7,964,912 B2 | 6/2011 | Parthasarathy et al. |
| 7,998,817 B2 | 8/2011 | Disney |
| 7,999,606 B2 | 8/2011 | Kung et al. |
| 8,022,456 B2 | 9/2011 | Parthasarathy et al. |
| 2004/0256669 A1* | 12/2004 | Hower et al. ............ 257/335 |
| 2005/0167742 A1 | 8/2005 | Challa et al. |
| 2005/0167749 A1* | 8/2005 | Disney ..................... 257/341 |
| 2005/0218963 A1 | 10/2005 | Ball et al. |
| 2008/0197396 A1 | 8/2008 | Parthasarathy |
| 2008/0197397 A1 | 8/2008 | Parthasarathy et al. |
| 2008/0197406 A1 | 8/2008 | Parthasarathy et al. |

FOREIGN PATENT DOCUMENTS

| | | |
|---|---|---|
| EP | 0987766 | 3/2000 |
| EP | 1689001 | 8/2006 |
| JP | 9298298 | 11/1997 |
| JP | 10107282 | 4/1998 |
| JP | 10256545 | 9/1998 |
| JP | 11233765 | 8/1999 |
| JP | 2001168329 | 6/2001 |
| JP | 2004079955 | 3/2004 |
| JP | 2004200540 | 7/2004 |
| JP | 2006216927 | 8/2006 |
| JP | 2006351930 | 12/2006 |

* cited by examiner

US 8,552,493 B2

SEGMENTED PILLAR LAYOUT FOR A HIGH-VOLTAGE VERTICAL TRANSISTOR

This application is a continuation of application Ser. No. 11/707,406, filed Feb. 16, 2007, entitled, "SEGMENTED PILLAR LAYOUT FOR A HIGH-VOLTAGE VERTICAL TRANSISTOR", which is assigned to the assignee of the present application.

TECHNICAL FIELD

The present disclosure relates to semiconductor device structures and processes for fabricating high-voltage transistors.

BACKGROUND

High-voltage, field-effect transistors (HVFETs) are well known in the semiconductor arts. Many HVFETs employ a device structure that includes an extended drain region that supports or blocks the applied high-voltage (e.g., several hundred volts) when the device is in the "off" state. In a conventional vertical HVFET structure, a mesa or pillar of semiconductor material forms the extended drain or drift region for current flow in the on-state. A trench gate structure is formed near the top of the substrate, adjacent the sidewall regions of the mesa where a body region is disposed above the extended drain region. Application of an appropriate voltage potential to the gate causes a conductive channel to be formed along the vertical sidewall portion of the body region such that current may flow vertically through the semiconductor material, i.e., from a top surface of the substrate where the source region is disposed, down to the bottom of the substrate where the drain region is located.

In a traditional layout, a vertical HVFET consists of long continuous silicon pillar structure that extends across the semiconductor die, with the pillar structure being repeated in a direction perpendicular to the pillar length. One problem that arises with this layout, however, is that it tends to produce large warping of the silicon wafer during high temperature processing steps. In many processes, the warping is permanent and large enough to prevent the wafer from tool handling during subsequent processing steps.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

DETAILED DESCRIPTION

In the following description specific details are set forth, such as material types, dimensions, structural features, processing steps, etc., in order to provide a thorough understanding of the present invention. However, persons having ordinary skill in the relevant arts will appreciate that these specific details may not be needed to practice the present invention. It should also be understood that the elements in the figures are representational, and are not drawn to scale in the interest of clarity.

Figure 1:
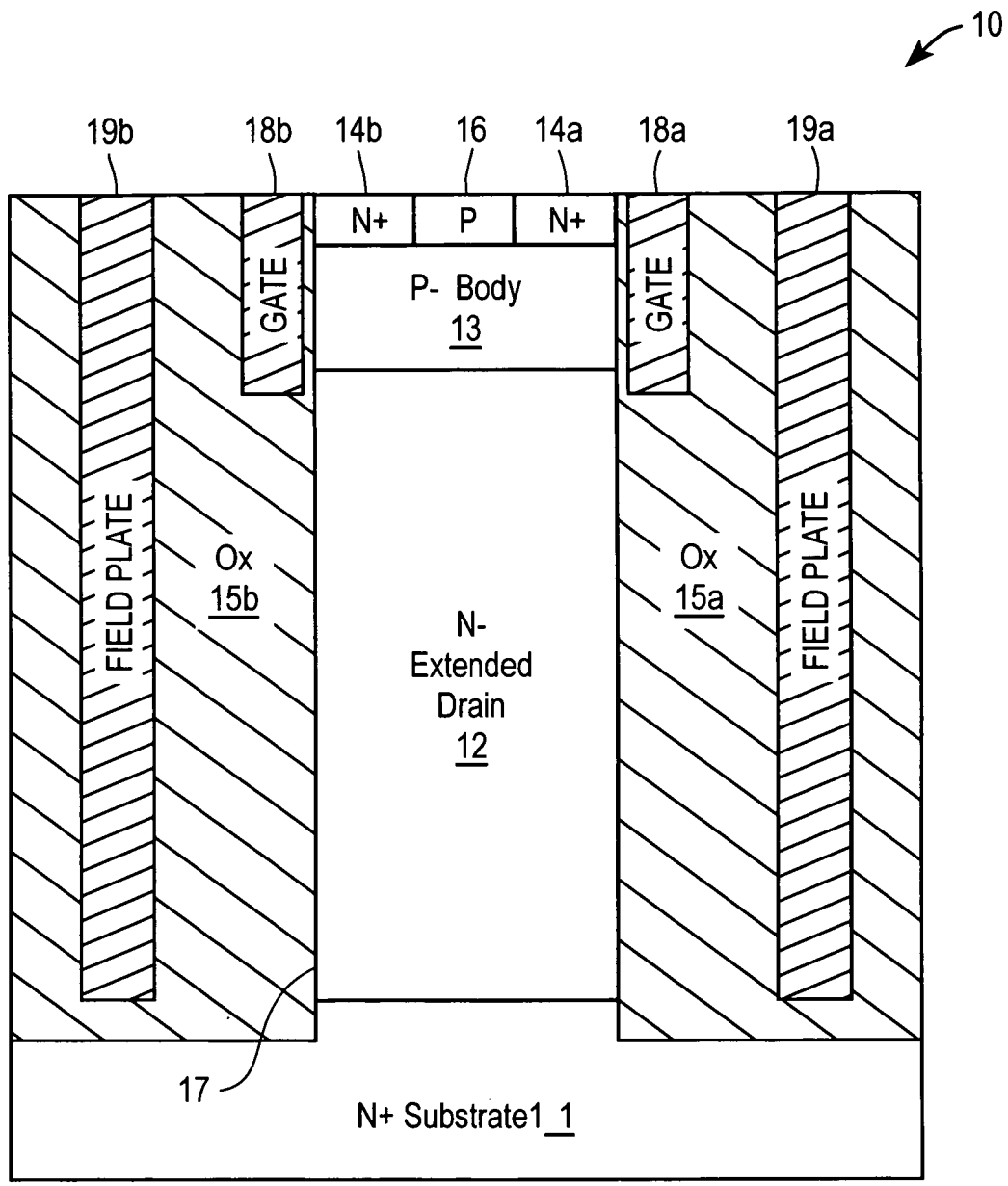
FIG. 1 illustrates an example cross-sectional side view of a vertical HVFET structure.

FIG. 1 illustrates an example cross-sectional side view of a vertical HVFET 10 having a structure that includes an extended drain region 12 of N-type silicon formed on an N+ doped silicon substrate 11. Substrate 11 is heavily doped to minimize its resistance to current flowing through to the drain electrode, which is located on the bottom of the substrate in the completed device. In one embodiment, extended drain region 12 is part of an epitaxial layer that extends from substrate 11 to a top surface of the silicon wafer. A P-type body region 13 and N+ doped source regions 14a & 14b laterally separated by a P-type region 16, are formed near a top surface of the epitaxial layer. As can be seen, P-type body region 13 is disposed above and vertically separates extended drain region 12 from N+ source regions 14a & 14b and P-type region 16.

In one embodiment, the doping concentration of the portion of epitaxial layer which comprises extended drain region 12 is linearly graded to produce an extended drain region that exhibits a substantially uniform electric-field distribution. Linear grading may stop at some point below the top surface of the epitaxial layer 12.

Extended drain region 12, body region 13, source regions 14a & 14b and P-type region 16 collectively comprise a mesa or pillar 17 (both terms are used synonymously in the present application) of silicon material in the example vertical transistor of FIG. 1. Vertical trenches formed on opposite sides of pillar 17 are filled with a layer of dielectric material (e.g., oxide) that makes up dielectric region 15. The height and width of pillar 17, as well as the spacing between adjacent vertical trenches may be determined by the breakdown voltage requirements of the device. In various embodiments, mesa 17 has a vertical height (thickness) in a range of about 30 µm to 120 µm thick. For example, a HVFET formed on a die approximately 1 mm×1 mm in size may have a pillar 17 with a vertical thickness of about 60 µm. By way of further example, a transistor structure formed on a die of about 2 mm-4 mm on each side may have a pillar structure of approximately 30 µm thick. In certain embodiments, the lateral width of pillar 17 is as narrow as can be reliably manufactured (e.g., about 0.4 µm to 0.8 µm wide) in order to achieve a very high breakdown voltage (e.g., 600-800V).

In another embodiment, instead of arranging P-type region 16 between N+ source regions 14a & 14b across the lateral width of pillar 17 (as shown in FIG. 1), N+ source regions and P-type regions may be alternately formed at the top of pillar 17 across the lateral length of pillar 17. In other words, a given cross-sectional view such as that shown in FIG. 1 would have either an N+ source region 14, or a P-type region 16, that extends across the full lateral width of pillar 17, depending upon where the cross-section is taken. In such an embodiment, each N+ source region 14 is adjoined on both sides (along the lateral length of the pillar) by P-type regions 16. Similarly, each P-type region 16 is adjoined on both sides (along the lateral length of the pillar) by N+ source regions 14.

Dielectric regions 15a & 15b may comprise silicon dioxide, silicon nitride, or other suitable dielectric materials. Dielectric regions 15 may be formed using a variety of well-known methods, including thermal growth and chemical vapor deposition. Disposed within each of the dielectric layers 15, and fully insulated from substrate 11 and pillar 17, is a field plate 19. The conductive material used to from field plates 19 may comprise a heavily doped polysilicon, a metal (or metal alloys), a silicide, or other suitable materials. In the completed device structure, field plates 19a & 19b normally function as capacitive plates that may be used to deplete the extended drain region of charge when the HVFET is in the off state (i.e., when the drain is raised to a high voltage potential). In one embodiment, the lateral thickness of oxide region 15 that separates each field plate 19 from the sidewall of pillar 17 is approximately 4 µm.

The trench gate structure of vertical HVFET transistor 80 comprises gate members 18a & 18b, each respectively disposed in oxide regions 15a & 15b on opposite sides of pillar 17 between field plates 19a & 19b and body region 13. A high-quality, thin (e.g., ~500 Å) gate oxide layer separates gate members 18 from the sidewalls of pillar 17 adjacent body region 13. Gate members 18 may comprise polysilicon, or some other suitable material. In one embodiment, each gate member 18 has a lateral width of approximately 1.5 µm and a depth of about 3.5 µm.

Practitioners in the art will appreciate that N+ source regions 14 and P-type body region 13 near the top of pillar 17 may each be formed using ordinary deposition, diffusion, and/or implantation processing techniques. After formation of the N+ source region 38, HVFET 10 may be completed by forming source, drain, gate, and field plate electrodes that electrically connect to the respective regions/materials of the device using conventional fabrication methods (not shown in the figures for clarity reasons).

Figure 2B:
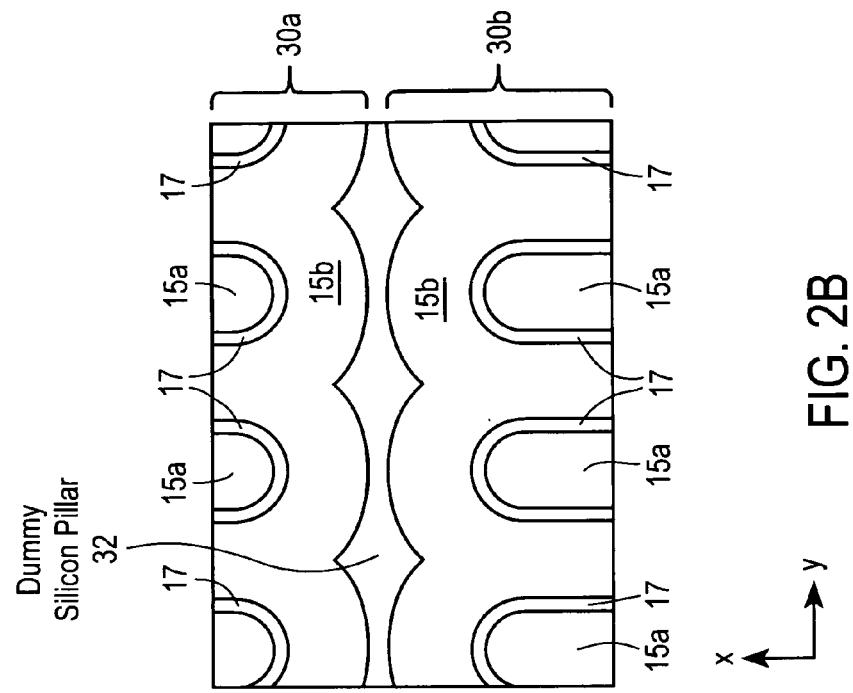
FIG. 2B is an expanded view of one portion of the example layout shown in FIG. 2A.
Figure 2A:
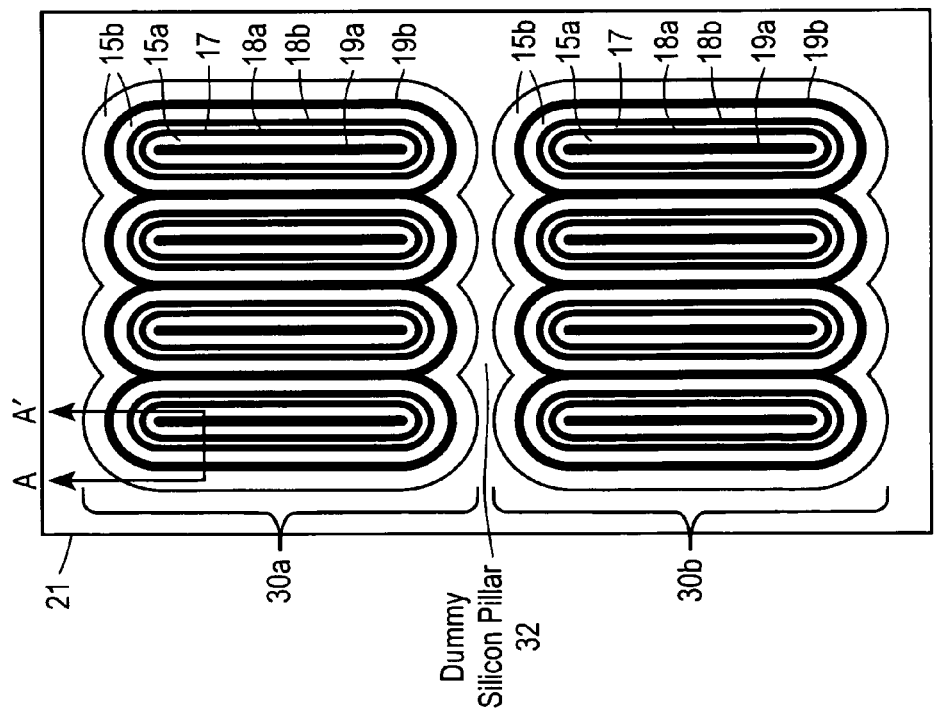
FIG. 2A illustrates an example layout of the vertical HVFET structure shown in FIG. 1.

FIG. 2A illustrates an example layout of the vertical HVFET structure shown in FIG. 1. The top view of FIG. 2A shows a single, discrete HVFET comprising an upper transistor section 30a and a lower transistor section 30b on a semiconductor die 21. The two sections are separated by a dummy silicon pillar 32. Each section 30 comprises a plurality of "racetrack" shaped transistor structures or segments, each transistor segment comprises an elongated ring or oval that includes a silicon pillar 17 surrounded on opposite sides by dielectric regions 15a & 15b. Pillar 17, itself, extends laterally in the x and y directions to form a continuous, elongated, racetrack-shaped ring or oval. Disposed within dielectric regions 15a & 15b are respective gate members 18a & 18b and field plates 19a & 19b. Field plate 19a comprises a single elongated member that terminates on either end in a rounded fingertip area. Field plate 19b, on the other hand, comprises an enlarged ring or oval that encircles pillar 17. Field plates 19b of adjacent racetrack structures are shown merged such that they share a common member on a side. By way of reference, the cross-sectional view of FIG. 1 may be taken through cut lines A-A' of the example layout of FIG. 2A.

It should be understood that in the example of FIG. 2A, each of the racetrack transistor segments has a width (i.e., pitch) in the y-direction of approximately 13 µm, a length in the x-direction in a range of about 400 µm to 1000 µm, with a pillar height of about 60 µm. In other words, the length to width ratio of the individual racetrack transistor segments comprising sections 30a & 30b is in a range of about 30 up to 80. In one embodiment, the length of each racetrack shaped segment is at least 20 times greater than its pitch or width.

Practitioners in the art will appreciate that in the completed device structure, patterned metal layers are used to interconnect each of the silicon pillars 17 of the individual transistor segments. That is, in a practical embodiment, all of the source regions, gate members, and field plates are respectively wired together to corresponding electrodes on the die. In the embodiment shown, the transistor segments in each section 30 are arranged in a side-by-side relationship in the y-direction substantially across a width of die 21. Similarly, in the x-direction the additive length of the transistor segments of sections 30a & 30b extend substantially over the length of die 21. In the example layout of FIG. 2A the width of dielectric regions 15 separating the silicon pillars, as well as the width of the field plates, is substantially uniform across semiconductor die 21. Laying out the transistor segments with uniform widths and separation distances prevents the formation of voids or holes following the processing steps used to conformably deposit the layers that comprise dielectric regions 15 and field plates 19.

FIG. 2B is an expanded view of one portion of the example layout shown in FIG. 2A. For purposes of clarity, only pillars 17 and dielectric regions 15a & 15b of each of the transistor segments is represented. Dummy silicon pillar 32 is shown separating the rounded end areas of dielectric regions 15b of respective transistor segment sections 30a & 30b. In other words, the deep vertical trenches that are etched in the semiconductor substrate to define pillars 17 also define dummy silicon pillar 32. In one embodiment, dummy silicon pillar 32 is made to have a width in the x-direction (i.e., that separates the transistor segment sections) that is as small as can be reliably manufactured.

The purpose of segmenting the single die HVFET into sections separated by dummy silicon pillar 32 is to introduce lengthwise (x-direction) stress-relief in the elongated racetrack shaped transistor segments. Segmenting or breaking the transistor device structures into two or more sections relieves mechanical stress across the length of the die. This stress is induced by the oxide regions flanking the pillars and normally concentrates at the rounded ends of each racetrack segment. Relieving mechanical stress by segmenting the transistor device structures into two or more sections thus prevents undesirable warping of the silicon pillars and damage (e.g., dislocations) to the silicon caused by stress.

It is appreciated that a tradeoff exists between the stress relief provided by a highly segmented layout and loss of conduction area. More segmentation results in greater stress relief, but at the expense of conduction area. In general, the greater the vertical height of the pillars and the larger the semiconductor die, the greater the number of transistor sections or segments that will be required. In one embodiment, for a 2 mm×2 mm die with 60 µm high pillars, adequate stress relief is provided in a HVFET with an on-resistance of about 1 ohm utilizing a layout comprising four racetrack transistor sections separated by dummy silicon pillars, each having a pitch (x-direction) of about 13 µm and a length (y-direction) of about 450 µm.

In another embodiment, instead of a dummy pillar of silicon to separate pairs of racetrack transistor segments, each pair being located in a different section, a dummy pillar comprising a different material may be utilized. The material used for the dummy pillar should have a thermal coefficient of expansion close to that of silicon, or sufficiently different from that of the dielectric region so as to relieve the lengthwise stress induced by the dielectric regions flanking the silicon pillars.

Figure 3B:
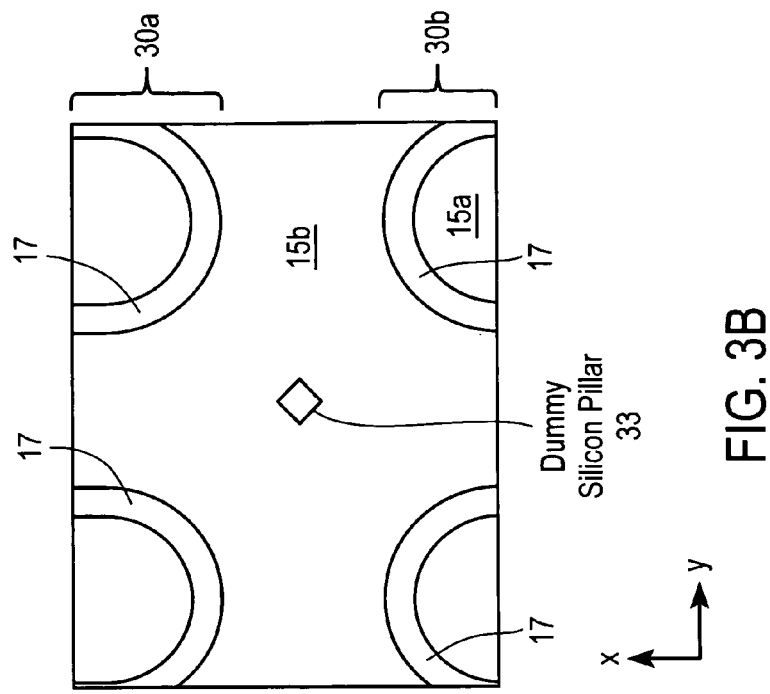
FIG. 3B is an expanded view of one portion of the example layout shown in FIG. 3A.
Figure 3A:
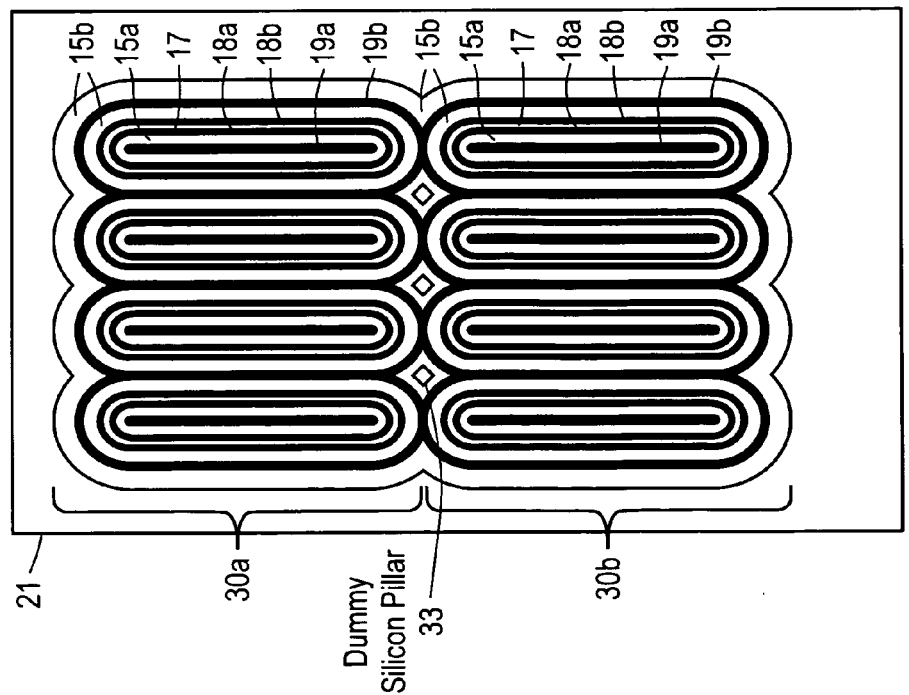
FIG. 3A illustrates another example layout of the vertical HVFET structure shown in FIG. 1.

FIG. 3A illustrates another example layout of the vertical HVFET structure shown in FIG. 1. FIG. 3B is an expanded view of one portion of the example layout shown in FIG. 3A, just showing pillars 17, oxide region 15b, and an optional dummy silicon pillar 33. Similar to the embodiment of FIGS. 2A & 2B, FIGS. 3A & 3B show a single, discrete HVFET comprising an upper transistor section 30a and a lower transistor section 30b on a semiconductor die 21. But in the example of FIGS. 3A & 3B, the deep vertical trenches filled with oxide regions 15b and field plates 19b of transistor sections 30a and 30b overlap, or are merged, leaving small, diamond-shaped dummy silicon pillars 33 between the segmented transistor sections. In this embodiment, a single dummy pillar is centrally located between the four rounded ends of adjacent pairs of transistor segments over the two sections. In the example shown, for every N (where N is an integer greater than 1) racetrack segments or structures in a section 30 of the transistor comprising die 21, there are a total of N−1 dummy pillars 33.

Figure 4B:
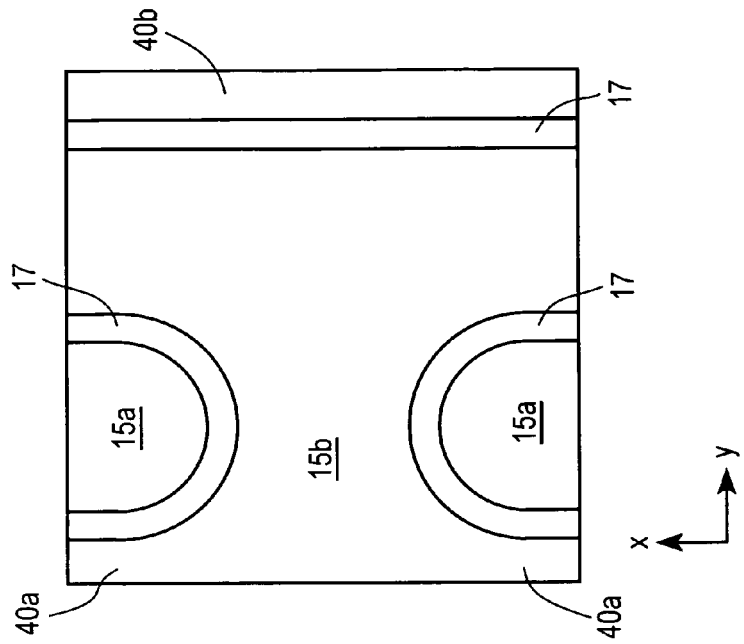
FIG. 4B is an expanded view of one portion of the example layout shown in FIG. 4A.
Figure 4A:
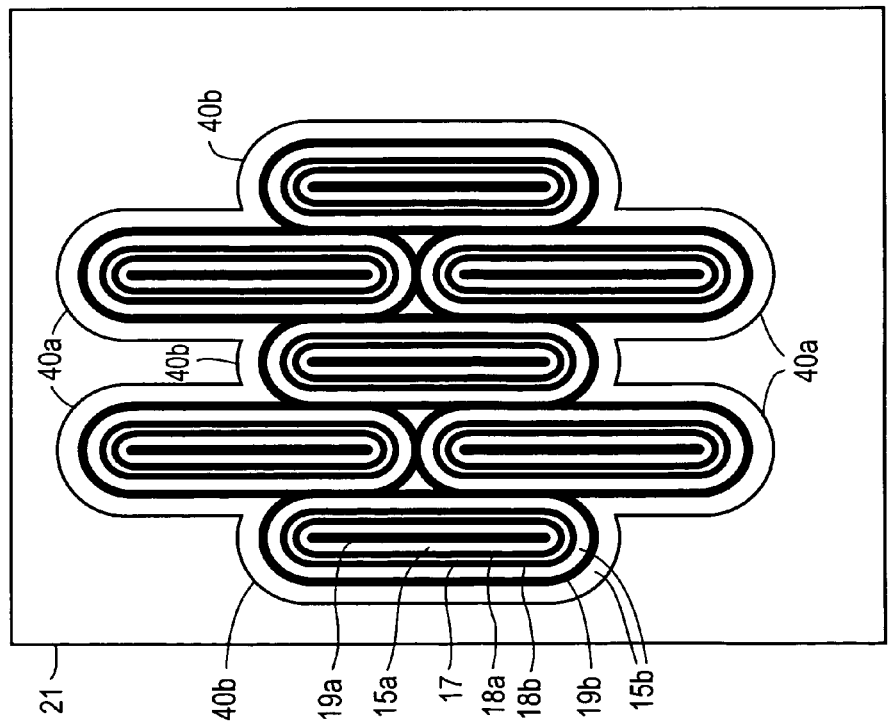
FIG. 4A illustrates yet another example layout of the vertical HVFET structure shown in FIG. 1.
Figure 5:
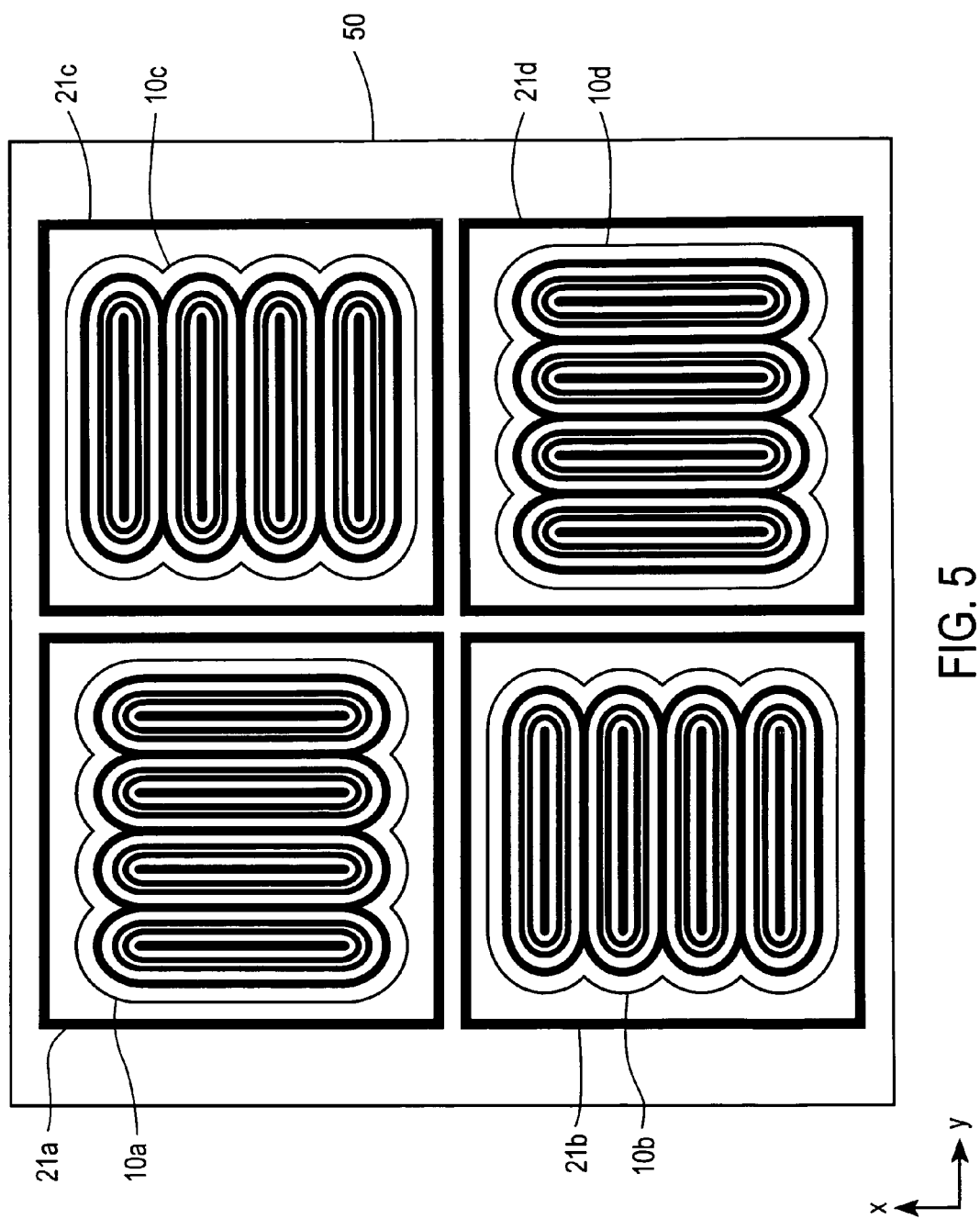
Figure 6:
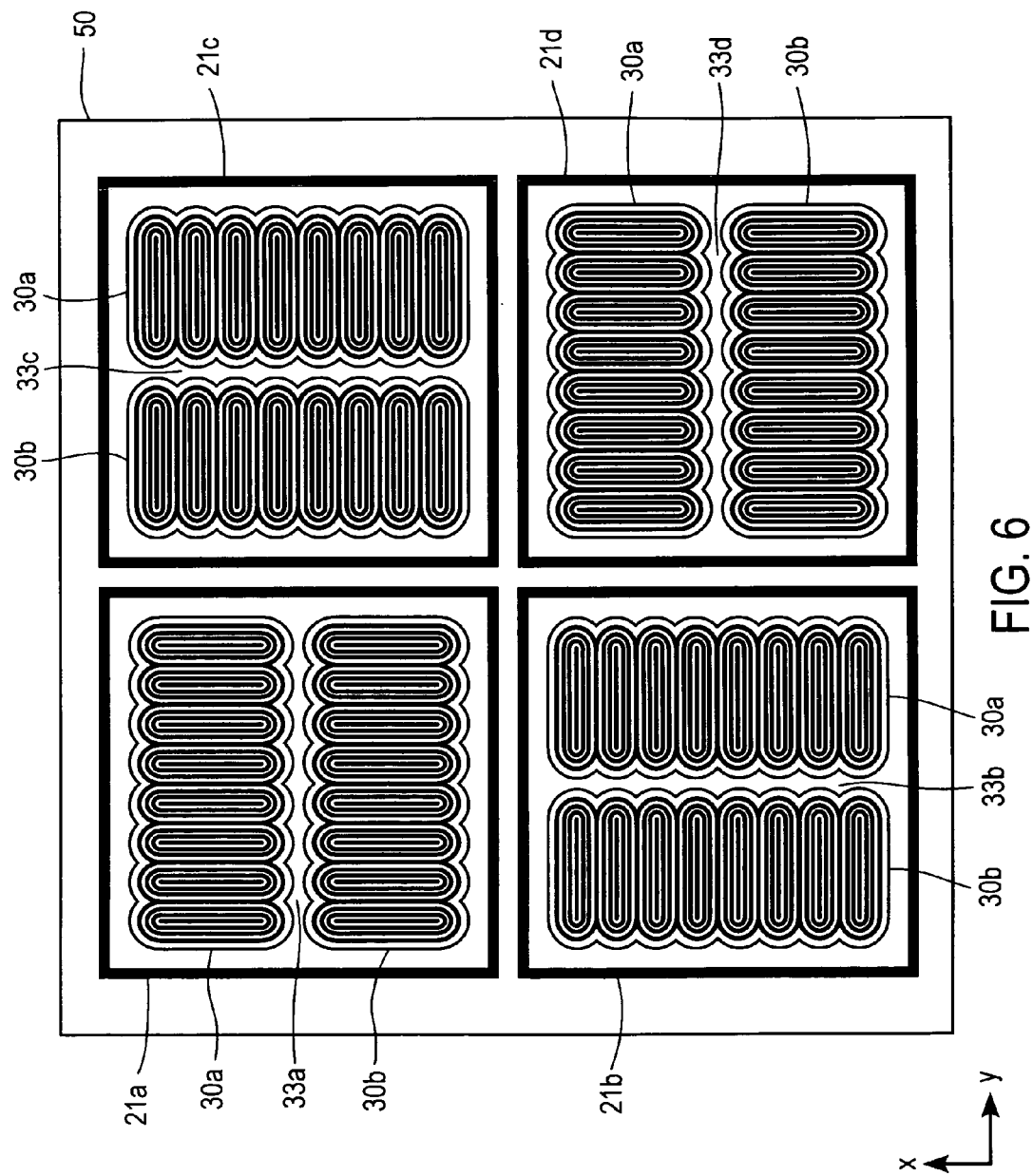
Figure 7:
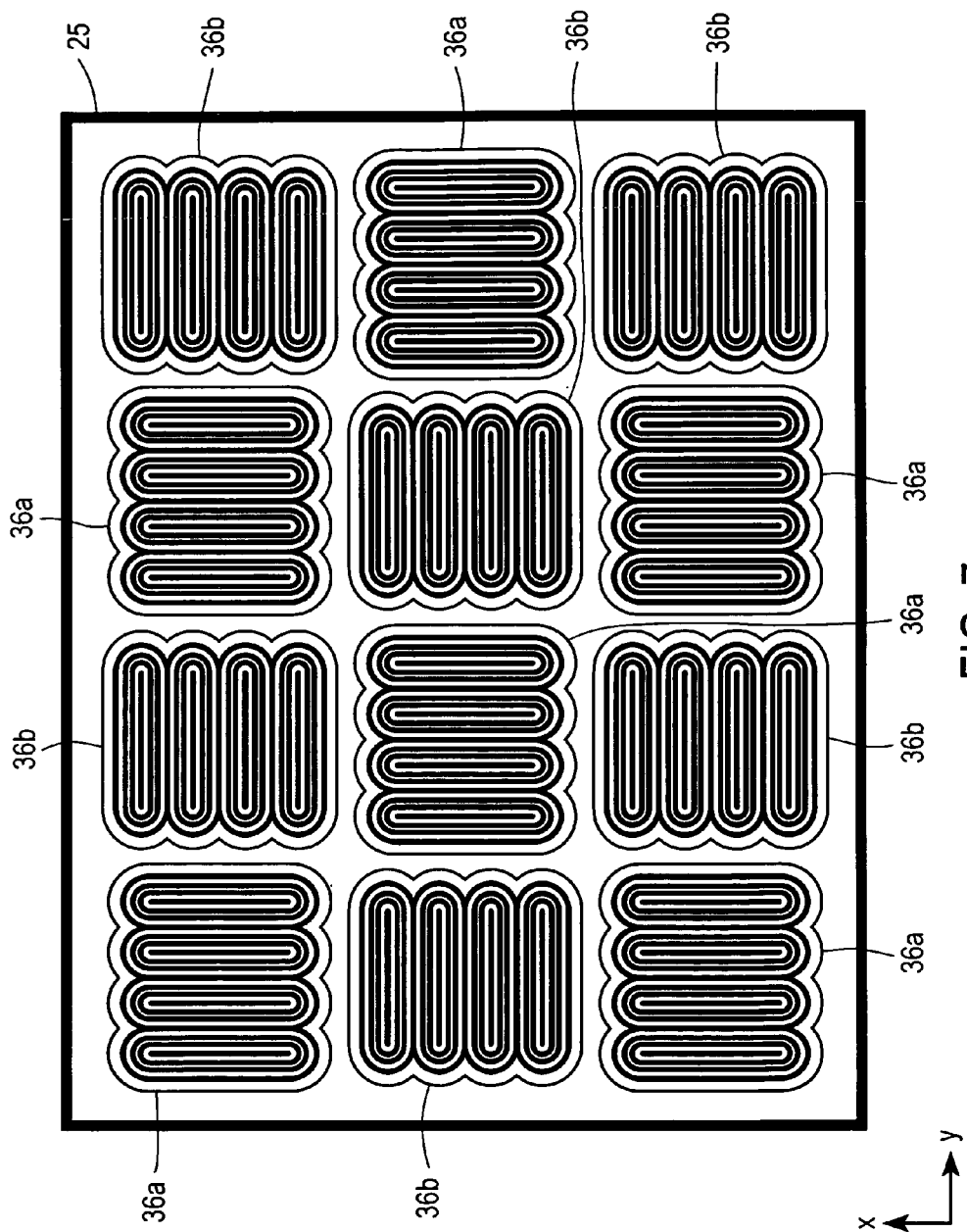

FIG. 4A illustrates yet another example layout of the vertical HVFET structure shown in FIG. 1. FIG. 4B is an expanded view of one portion of the example layout shown in FIG. 4A. Pillars 17 and oxide region 15b are just shown for clarity reasons in the expanded view of FIG. 4B. In this example, the transistor segments comprising the HVFET of semiconductor die 21 are alternately shifted by half of the length of each racetrack segment, resulting in racetrack transistor segments that are alternately associated with upper transistor section 40a and lower transistor section 40b. In other words, each of the transistor segments of a row of section 40a is separated by a pair of the transistor segments of section 40b, the pair being arranged in an end-to-end relationship in the x-direction.

It is appreciated that the alternate shifting of the segments may be any fraction of the segment length. In other words, shifting of the segments is not limited to 50% or half the length. Various embodiments may comprise segments alternately shifted by any percentage or fraction ranging from greater than 0% to less than 100% of the length of the transistor segments.

In the example of FIGS. 4A & 4B, the dielectric regions 15b of alternating ones of the transistor segments in respective sections 40a & 40b are merged. In the specific embodiment shown, the rounded ends of the transistor segments associated with different adjacent sections overlap or are merged such that field plates 19b of the adjacent sections are merged at the ends (in the x-direction). Also, the extended straight side portions of field plates 19b of alternating transistor segments of different sections are merged along a substantial length of each segment. It is appreciated that regions 15b and 19b may be merged with or without a dummy pillar (or isolated dummy silicon pillars) between the respective sections.

Although the above embodiments have been described in conjunction with a specific device types, those of ordinary skill in the arts will appreciate that numerous modifications and alterations are well within the scope of the present invention. For instance, although HVFETs have been described, the methods, layouts and structures shown are equally applicable to other structures and device types, including Schottky, diode, IGBT and bipolar structures. Accordingly, the specification and drawings are to be regarded in an illustrative rather than a restrictive sense.

We claim:
1. An apparatus comprising:
a plurality of transistor segments arranged on a die, each transistor segment having an elongated annular shape with a length elongated in a first lateral direction and a width in a second lateral direction, each transistor segment including:
a pillar of a semiconductor material, the pillar including a drift region that extends in a vertical direction through the die;
a first and second dielectric regions disposed on opposite sides of the pillar, respectively, the first dielectric region being laterally surrounded by the pillar, and the second dielectric region laterally surrounding the pillar;
first and second field plates respectively disposed in the and second dielectric regions;
wherein the transistor segments are arranged into a plurality of sections, a first section comprising a first row of transistor segments arranged in a side-by-side relationship in the second lateral direction with the second dielectric region of each transistor segment of the first section being merged, a second section comprising a second row of transistor segments arranged in the side-by-side relationship in the second lateral direction with the second dielectric region of each transistor segment of the second section being merged, the merged second dielectric region of the first section being separated from the merged second dielectric region of the second section in the first lateral direction by a dummy pillar of the semiconductor material, the dummy pillar having a width in the first lateral direction that is substantially smaller than the length of each transistor segment.
2. The apparatus of claim 1 wherein the first and second sections each extend in the second lateral direction substantially across a width of the die, the first section and the second section additively extending in the first lateral direction substantially across a length of the die.
3. The apparatus of claim 1 wherein the pitch and a length in the second lateral direction of the dummy pillar are sufficiently sized to relieve mechanical stress induced by the first and second dielectric regions disposed on opposite sides of the pillar of each transistor segment.
4. The apparatus of claim 1 wherein the pitch and a length in the second lateral direction of the dummy pillar are sufficiently sized to relieve mechanical stress induced by the first and second dielectric regions disposed on opposite sides of the pillar of each transistor segment.
5. The apparatus of claim 1 wherein the pillar further comprises a source region disposed near a top surface of the die, and a body region that vertically separates the source region from the extended drain region.
6. The apparatus of claim 5 further comprising a gate disposed within the first and second dielectric regions adjacent the body region, the gate being insulated from the body region and the first and second field plates.

* * * * *